United States Patent [19]

Nagatomo et al.

[11] Patent Number: 4,544,318
[45] Date of Patent: Oct. 1, 1985

[54] MANUFACTURING SYSTEM

[75] Inventors: Hiroto Nagatomo, Tokyo; Hisashi Maejima, Higashiyamato; Jun Suzuki, Higashimurayama; Keishin Fujikawa, Ohme, all of Japan

[73] Assignee: Hitachi, Ltd., Tokyo, Japan

[21] Appl. No.: 477,895

[22] Filed: Mar. 23, 1983

Related U.S. Application Data

[63] Continuation of Ser. No. 168,737, Jul. 14, 1980, abandoned.

[30] Foreign Application Priority Data

Jul. 27, 1979 [JP] Japan .................................. 54-95004

[51] Int. Cl.4 ............................................. B65G 1/06
[52] U.S. Cl. ........................................ 414/222; 52/33;
52/234; 198/346; 29/33 P
[58] Field of Search .................... 52/33, 234, 205, 239;
198/340, 349, 309, 346; 414/222-225, 273, 282;
104/88; 29/56, 8, 569, 563, 650, 33 P

[56] References Cited

U.S. PATENT DOCUMENTS

| | | | |
|---|---|---|---|
| 3,817,406 | 6/1974 | Sawada et al. | 414/273 |
| 4,015,530 | 4/1977 | Sato | 104/88 |
| 4,282,825 | 8/1981 | Nagamoto et al. | 118/58 |

FOREIGN PATENT DOCUMENTS

| | | |
|---|---|---|
| 2218610 | 8/1972 | Fed. Rep. of Germany . |
| 2347969 | 6/1974 | Fed. Rep. of Germany . |
| 948450 | 2/1964 | United Kingdom . |
| 1255939 | 12/1971 | United Kingdom . |
| 1314590 | 4/1973 | United Kingdom . |
| 521197 | 9/1976 | U.S.S.R. ................................ 104/88 |

Primary Examiner—Terrance L. Siemens
Attorney, Agent, or Firm—Antonelli, Terry & Wands

[57] ABSTRACT

A manufacturing system in which the automatic control of the system and the automatic control of a process management are organically coupled, thereby to sharply reduce the number of workers to be engaged in the manufacture. In order to establish both the versatility necessary for multiple type of treatment and the high efficiency necessary for large-quantity treatments, the arrangement of respective treatment sections is made the job-shop-type, and the construction of treating devices themselves included in the treatment sections is made the flow-shop-type, to achieve the consecutive automation. In order to also automate the management of the process, a stocker in which unfinished products are put is situated in a specified place of the system such as the central part thereof, while the process is put forward in such a manner that a conveyor machine controlled by a control unit having a computer reciprocates between the stocker and the groups of treatment sections. The manufacturing system is suitable for the fabrication of semiconductor devices which have many kinds of articles where each kind of article needs to be mass-produced.

6 Claims, 9 Drawing Figures

MANUFACTURING SYSTEM

This is a continuation of application Ser. No. 168,737, filed July 14, 1980, now abandoned.

BACKGROUND OF THE INVENTION

This invention relates to an automated manufacturing system wherein in manufacturing many kinds of products, groups of processors respectively corresponding to treatments each extending over several steps and a conveyor (conveyor system) for carrying workpieces (pieces to be treated) to the respective groups of processors are arranged, and the treatment sequence, treatment conditions etc. of the multifarious kinds of workpieces are automatically obtained from input information, to control the conveyor, the groups of processors etc. This serves to operate them efficiently and organically so that the product management and the process management are optimized. More particularly, it relates to a processing system for semiconductor wafers for manufacturing semiconductor devices in the semiconductor industry.

Circuit elements for use in assembling semiconductor devices, integrated circuits, large-scale integrated circuits etc. are, in general, formed of semiconductor pellets. The pellets are obtained in such a way that circuit element regions arranged and formed in a thin semiconductor plate (wafer) in vertical and horizontal arrays are split at the boundaries thereof. In order to fabricate the circuit element regions in the wafer, a very large number of manufacturing steps are required. By way of example, a process for forming regions containing desired impurity atoms in a silicon wafer includes (1) the washing step of washing the wafer to render it clean, (2) the oxide film formation step of heat-treating the wafer to form an oxide film ($SiO_2$) in the surface thereof, (3) the resist coating step of applying a resist (photoresist) onto the oxide film and then drying it, (4) the exposure step of causing a part of the resist to sense light, (5) the resist partial-removal (etching) step of partially removing the resist having sensed the light or not having sensed it, (6) the oxide film partial-removal (etching) step of removing the exposed oxide film by employing as a mask the resist partially remaining on the oxide film, (7) the resist removal (etching) step of removing the resist remaining on the oxide film, (8) the diffusion step of depositing the impurity atoms onto the exposed silicon or causing them to permeate the surface layer portion thereof by employing the oxide film as a mask and by situating the silicon wafer in an impurity atmosphere or utilizing such a technique as CVD (chemical vapor deposition), evaporation and ion implantation, and applying heat again to diffuse the impurity to a desired depth, and (9) the removal (etching) step of removing the unnecessary oxide film of the wafer surface, etc. The technique which begins with the resist coating step (3) and ends in the resist removal step (7) is usually called the photolithography, which is repeatedly used for the formation of the circuit element. That is, it is employed for the formation of an interconnection layer, the formation of a protective film for passivation, etc. besides the impurity diffusion.

In addition, the course of the steps in the wafer processing in which the wafer is subjected to the various treatments as above stated differs depending upon the kind of the products because the respective kinds of the products have different contents of treatments. In this regard, if the so-called flow-shop-type in which job equipment is arranged in the order of the steps is adopted as an efficient job form, the workpieces flow smoothly, but each kind of the product needs to have an equipment arrangement peculiar thereto. Accordingly, when it is intended to mass-produce the various products, stupendous installations are required, which eventually makes the mass production impossible in practical use. Granting that the equipment is disposed for the respective kinds of the products in order to permit such mass production, there is the risk that the arrangement of the equipment will soon become old-fashioned and useless because the development of the semiconductor engineering is remarkable and the changes of products are radical. This leads to the disadvantage that the equipment investment is wasteful, so reduction of cost cannot be achieved. Therefore, as the so-called job-shop-type in which groups of equipment for performing common jobs are collectively arranged, the adoption of an expedient as illustrated in FIG. 1 is considered. There are disposed a diffusion chamber 2 in which a plurality of diffusion devices 1 are arranged, an ion implantation chamber 4 in which a plurality of ion implantation devices 3 are arranged, a photoresist chamber 7 in which a plurality of photoetching devices 5 and exposure devices 6 are arranged, a CVD evaporation chamber 9 in which a plurality of evaporation devices 8 etc. are arranged, and a test chamber 11 in which a plurality of probers 10 are arranged. In the respective groups of installations, multifarious kinds of workpieces in large numbers are treated once. Since, however, many kinds (several hundred kinds) of workpieces having different manufacturing methods (several tens of methods) are caused to flow in large numbers (several tens of thousand) at the same time in the wafer processings, it is difficult to skillfully manage the flow. In addition, long periods of time are taken until the products are finished up. Another disadvantage is that many workers are required. The job space in which the wafers are treated needs to be always kept clean. Nevertheless, the large number of workers move round in the treatment chambers in such arrangement, so that dust adhering to clothes and dust adhering to a floor etc. scatter by flying up and that the wafers are stained to lower the available percentage. Especially, as the pattern of the circuit element becomes finer, the job space is required to be cleaner. In this regard, in case where products having a very fine pattern are to be fabricated, the expedient as above described cannot possibly manufacture the products at a high available percentage.

On the other hand, human beings are essentially difficult to sustain in their most efficient state for very long. In the aforecited manufacturing system, this is also a cause for prolonging the period of time for completing the products.

It is therefore considered that the particulars of the wafer treating steps are individually made automatic, thereby to make the job in each step efficient and to enhance the available percentage owing to the maintenance of a clean job space.

It is also considered to process the information of the management of the proceedings of the steps by the use of a computer.

In these systems, however, the automation of a single step is subjected to the computer control, and the product management cannot be said to be satisfactory when viewed from the manufacturing course of a single kind of product. Moreover, since merely the individual steps are made automatic and the respective steps are independent themselves, the wafers must be carried by the worker between the automatic machines or the treatment spaces. This results in inevitably causing the stains of the wafers between the respective steps. The existence of the worker in the moving path of the wafers is a fatal cause for staining them.

SUMMARY OF THE INVENTION

An object of this invention is to provide a manufacturing system in which the treatments of workpieces such as wafer processings are performed in unmanned devices, thereby to prevent the workpieces from being stained, and in which a series of jobs of the workpieces are organically controlled to carry out the product management of multifarious kinds of workpieces in large numbers, thereby to shorten the period of time for finishing up products, to enhance the available percentage of the products and to reduce the number of workers required for the manufacture.

Another object of this invention is to provide a manufacturing system in which groups of various devices for treatments are intensively put together, thereby to make small a building site necessary for the installation of facilities.

Hereunder, this invention will be described with reference to the drawing.

DESCRIPTION OF THE PREFERRED EMBODIMENTS

Figure 1:
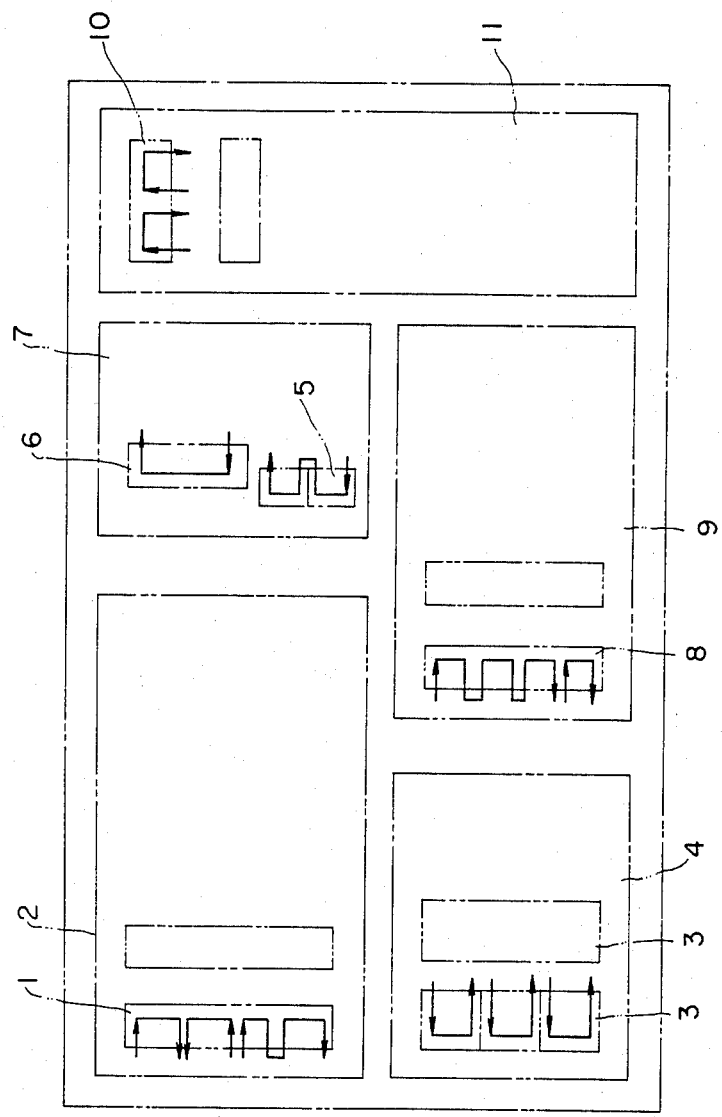
FIG. 1 is a layout showing wafer processing chambers.
Figure 2:
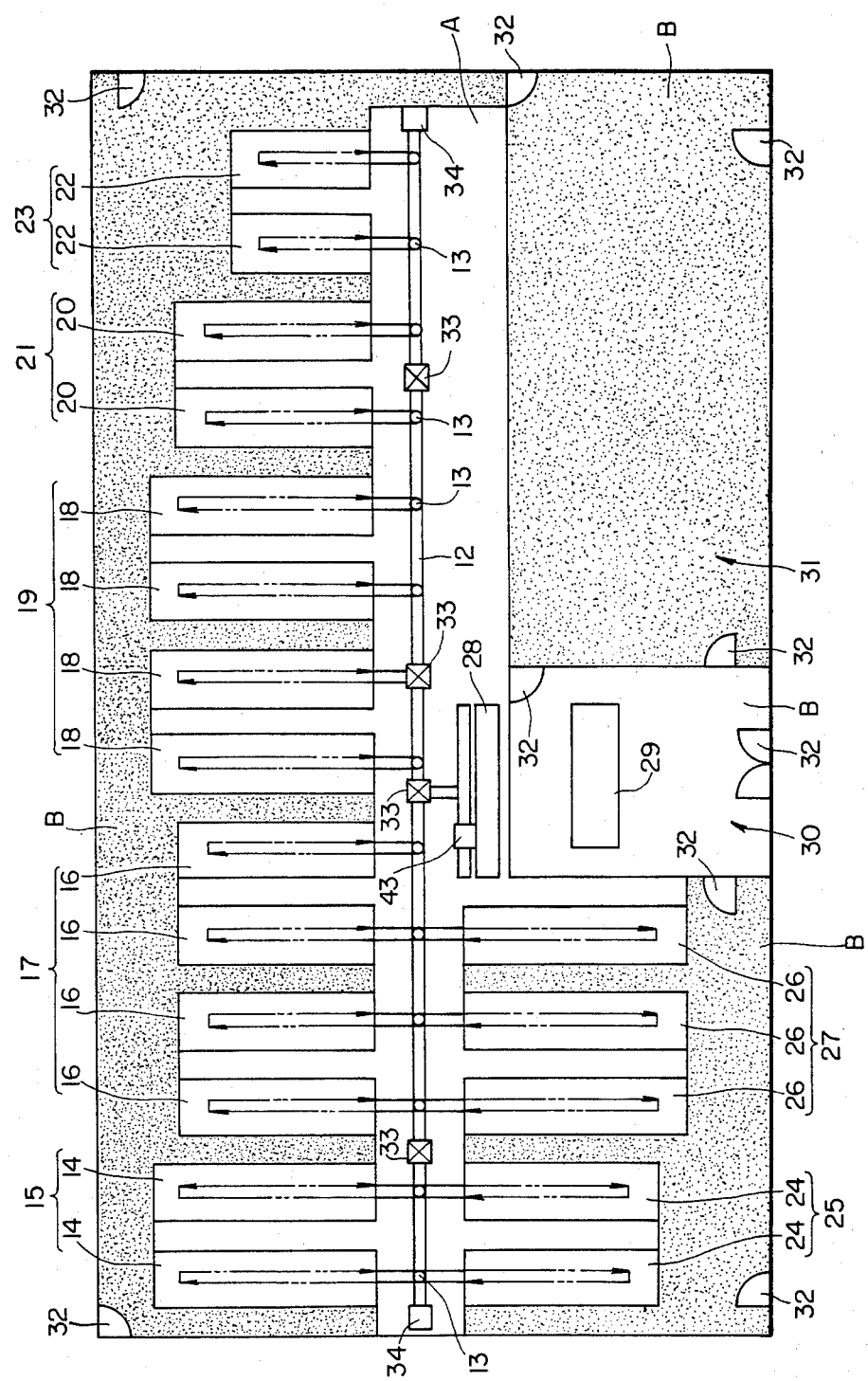
FIG. 2 is a plan view showing an embodiment of a manufacturing system of this invention.

FIGS. 2 to 8 are diagrams for explaining a manufacturing system for semiconductor devices in accordance with a preferred embodiment of this invention. FIG. 2 shows a schematic plan view of a manufacturing system according to this invention, especially a wafer processing system. This wafer processing system occupies the entirety or a part of a building, in which many pieces of equipment are arranged. In the middle of the building, a conveyance path 12 is disposed in a manner to extend in the lengthwise direction of the building. The conveyance path 12 has many stop places (illustrated by marks O) 13. A plurality of treatment sections each consisting of a plurality of devices for treatments are disposed on both the sides of the conveyance path 12. More specifically, on one side of the conveyance path 12, there are respectively arrayed a CVD treatment section 15 consisting of two automated CVD (chemical vapor deposition) devices 14, a diffusion treatment section 17 consisting of four automated diffusion devices 16, a light-sensing treatment section (exposure treatment section) 19 consisting of four automated photoresist light-sensing devices 18, an etching treatment section 21 consisting of two automated photoetching devices 20, and an ion implantation treatment section 23 consisting of two automated ion implantation devices 22. On the other side of the conveyance path 12, there are disposed an evaporation treatment section 25 consisting of two automated evaporation devices 24, a test treatment section 27 consisting of three automated probers 26, and an automated stocker 28. At the rear of the stocker 28, there is disposed a central information processing chamber 30 which is a glassed chamber and in which a central control unit 29 having a computer etc. is disposed. By the side of the stocker 28 as well as the central information processing chamber 30, an air-conditioning and dust-removing machinery room 31 is provided. An apparatus, not shown, for cleaning the air is disposed in the air-conditioning and dust-removing machinery room 31, and the air within the whole building is cleaned by the apparatus. Regions A in the figure, that is, a region in which the conveyance path 12 is provided, a region in which the stocker 28 is provided, regions in which the various devices for treatments are provided, and regions which oppose to the fronts of the various devices for treatments and the conveyance path 12 are kept at an especially high degree of air cleanness (regions B form preservation rooms for repairing and adjusting the various devices for treatments). In the figure, numerals 32 indicate doors.

Even in case of the same treatment, atmospheres for the treatment, for example, differ depending upon processes, and the auto-doping of workpieces with harmful impurities must be prevented. Therefore, the number of the devices for treatments in each treatment section increases. Also, in determining the number, the balance of the various devices is considered so that the flow of the workpieces in the whole building may be smoothed.

At one end of each device for treatment as corresponds to the stop place in the conveyance path 12, a loading station (loading position) and an unloading station (unloading position) for carrying the work in and out are respectively disposed. The work supplied to the loading station is automatically carried into the processing portion of each device for treatment and subjected to a predetermined treatment and is thereafter sent back to the unloading station as indicated by arrow in a two-dot chain line. The stop portion 13 also faces the stocker 28.

Figure 5:
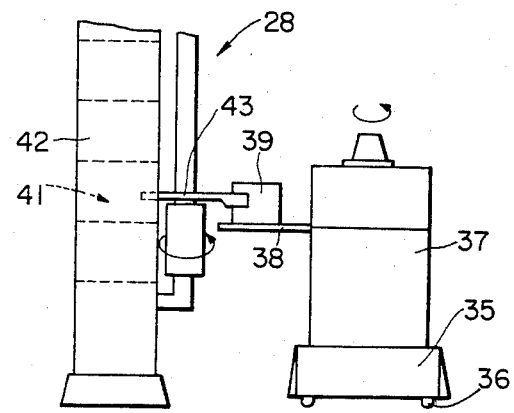
FIG. 5 is a front view showing the stocker and a conveyor in the embodiment.
Figure 6:
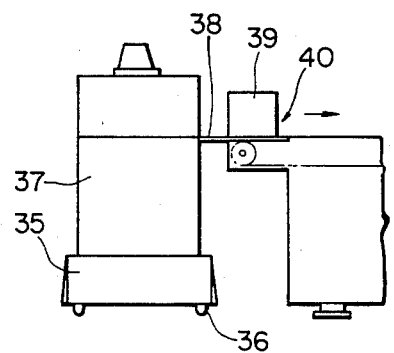
FIG. 6 is a front view showing the conveyor and a group of treating devices in the embodiment.
Figure 7:
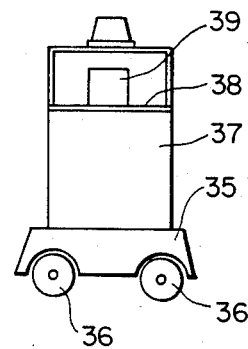
FIG. 7 is a side view of the conveyor in the embodiment.

On the other hand, conveyor devices (conveyors) 33 each holding and conveying a plurality of works (in this case, a cartridge receiving wafers, for example, a cartridge for transportation receiving 25 wafers in parallel) are disposed on the conveyance path 12. The conveyance devices 33 are disposed in the number of, for example, four, and they are individually controlled by the central control unit 29 to move on the conveyance path 12. At both the end parts of the conveyance path 12, there are provided conveyor device stand-by stations 34, in which the conveyor devices 33 which are not operating stand by. The conveyor device 33 has wheels 36 under a pedestal 35 as shown in FIGS. 5 to 7, and is moved under radio control. A work receiving arm 38 extends sidewards from a conveyor body 37 overlying the pedestal 35. It supports thereon the workpieces 39 carried out of the stocker 28 as shown in FIG. 5, and shifts them to the loading station 40 of the treating device as shown in FIG. 6. (In the unloading station, the works are received. The transfer means may be a generally known device or mechanism, and is provided, for example, on the side of each treating device.) The work receiving arm 38 is also adapted to turn over the pedestal 35. In addition, the conveyor device 33 moves along the conveyance path 12 while detecting tapes which are stuck along the conveyance path 12 and which can be detected by optical, magnetic, mechanical or the like means. By way of example, it advances to a destination while counting the stop places 13 of the conveyance path 12.

Figure 3:
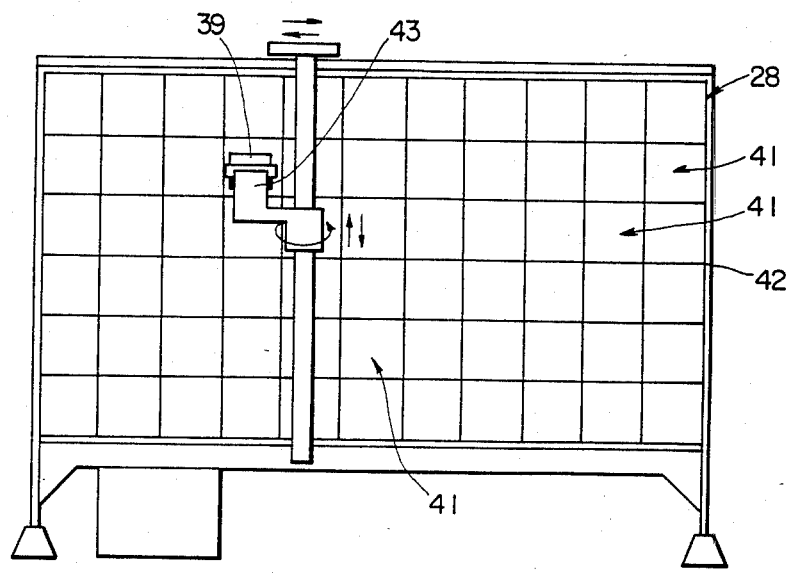
FIG. 3 is a front view of a stocker in the embodiment shown in FIG. 2.
Figure 4:
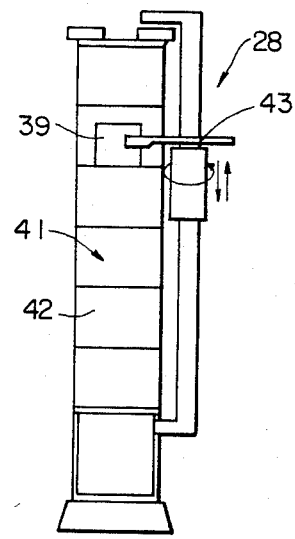
FIG. 4 is a side sectional view of the stocker in the embodiment.

As illustrated in FIGS. 3 and 4, the stocker 28 consists of a shelf 42 which has a plurality of accommodating portions 41 for accommodating the workpieces 39, and a transfer machine 43 which is free to move up or down and rightwards or leftwards in front of the shelf 42. Under the command of the central control unit 29, the transfer machine 43 takes out the workpieces 39 located at a predetermined position of the shelf 42 and supplies them to the conveyor device 33, or it holds the workpieces 39 carried by the conveyor device 33 and accommodates them into the empty accommodating portion 41 of the shelf. All the information regarding the location of the workpieces 39 in the shelf is provided by the central control unit 29.

Figure 8:
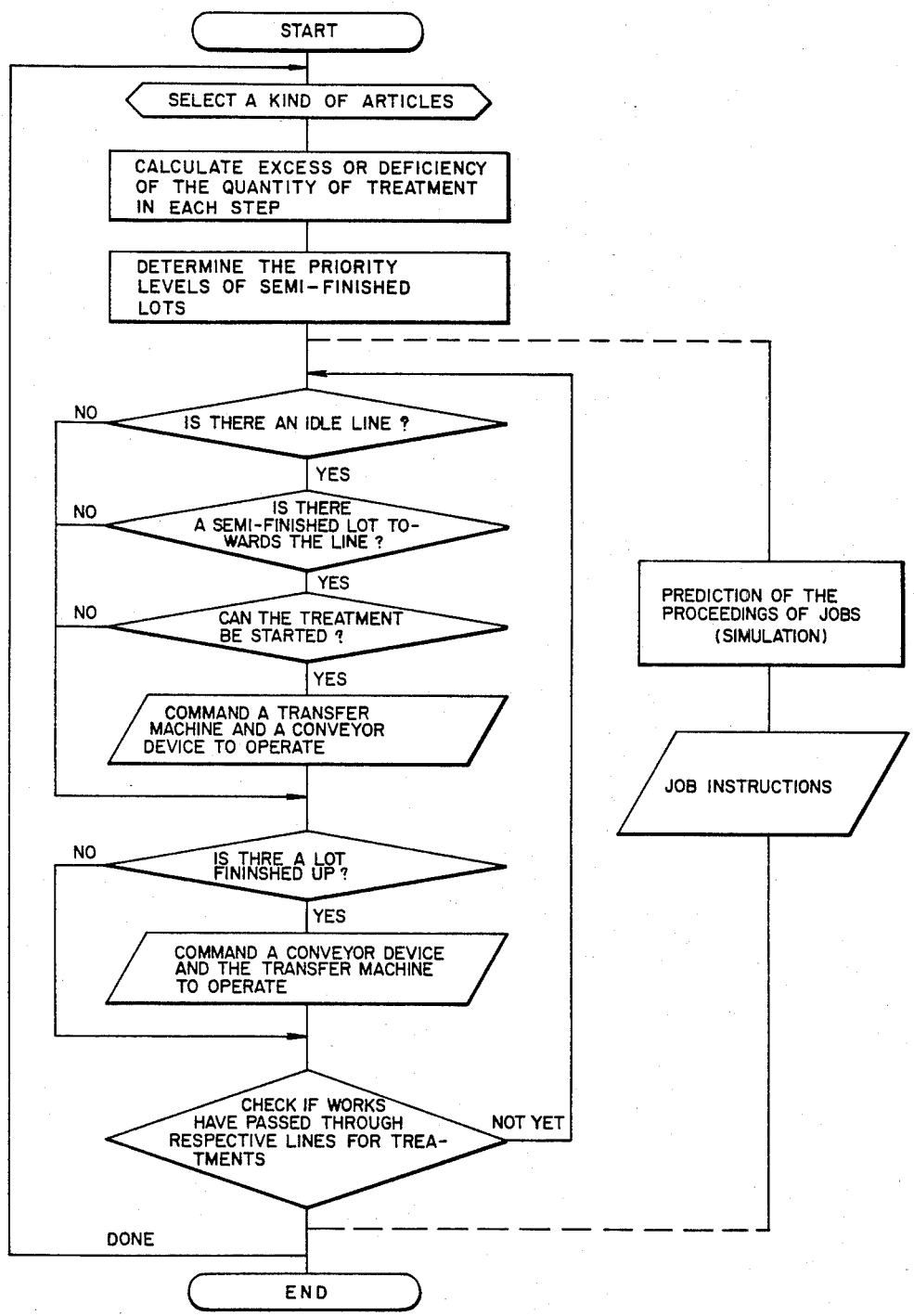
FIG. 8 is a flow chart of the control of the proceeding of treatment steps in the embodiment.

Referring now to a flow chart in FIG. 8, wafer processing operations will be described. First of all, all the workpieces (kinds of articles or lots to be treated) received in the stocker are confirmed (product management). When the kinds of articles (products) have been confirmed, treatments to be subsequently executed are known because process flows have been determined in advance. The present job states of the respective treating devices in each treatment section are confirmed, and the allowances and the finishing states thereof are examined. Further, the priority levels of the respective products (lots) are determined. These operations are executed on the basis of information stored in the central control unit. Thereafter, the presence or absence of an idle line (each device for treatment) is checked, and whether or not there are workpieces (lot) capable of using this line is checked. Further, whether or not the workpieces (lot) result in spoiling the priority levels is checked. If the priority levels are not spoilt, the conveyor device and the transfer machine are driven to prepare for carrying the workpieces to a predetermined device for treatment.

On the other hand, in parallel with the above operation, whether or not there is a lot finished up is checked. If such lot exists, the conveyor device and the transfer machine are driven to put the workpieces into the empty accommodating portion 41. After all the lines have been checked, the treating devices, the conveyor devices and the transfer machine are operated while continually predicting the proceedings of the jobs.

The central control unit sometimes executes, not only the process management and product management of the workpieces (lots), but also the management of the process conditions of the various treating devices and the collection of the process data thereof and further the management of groups of sequence controls of the treating devices. When all the managements are performed in the central control unit, the capacity of information storage, the quantity of calculations etc. become large, and the apparatus becomes large-sized. In order to avoid this drawback, it is also allowed that small-sized control units are contained also in the respective treating devices, the conveyor devices, the stocker etc. so as to divide the operations of storage, calculations, controls etc. among them and the central control unit. Over the central control unit, a control unit of larger size may well be situated.

The manufacturing system according to this invention as above stated couples organically the automatic control of the devices and the automatic control of the process management, thereby to sharply reduce the number of workers to be engaged in the manufacture. In order to establish both the versatility necessary for multi-kind treatments and the high efficiency necessary for large-quantity treatments, the arrangement of the respective treatment sections is made the job-shop-type, and the construction of the treating devices themselves included in the treatment sections is made the flow-shop-type, to achieve the consecutive automation. In order to also automate the management of the process, the stocker in which unfinished products are put is situated in a specified place of the system such as the central part thereof, while the process is put forward in such a manner that the conveyor device controlled by the control unit having the computer reciprocates between the stocker and the groups of treatment sections.

Accordingly, the manufacturing system of this invention brings forth the following effects:

(1) The so-called flow-shop-type wherein workpieces are subjected to the same sorts of jobs by treatment devices in the same treatment section and wherein they are carried among various treatment sections by the use of a conveyor device is adopted, and these operations are automatically managed by a control unit by taking also the product management and the process management into account. Therefore, the various treatment devices operate efficiently, and lots have their wafer processings completed successively from a desired lot, so that the job efficiency becomes high. Process conditions, a process monitor etc. are also controlled by the computer, so that stable treatment of high quality are made.

(2) Since this system is of the flow-shop-type which partly adopts the job-shop-type, the area of a building site can be made narrower than in the prior art.

(3) In principle, an operator does not enter the region in which wafers move. Since the operator who is the source of generation of a large quantity of dust does not exist, the stains of the wafers decrease and the available percentage rises.

(4) Since the respective treating devices are repaired and adjusted from the rear as shown by the regions B in FIG. 2, a space requiring a high degree of cleanness becomes smaller, and an air cleaner equipment can be made smaller in size than that in the prior art.

(5) Since all the jobs are rendered automatic in this system, the number of workers can be reduced.

Figure 9:
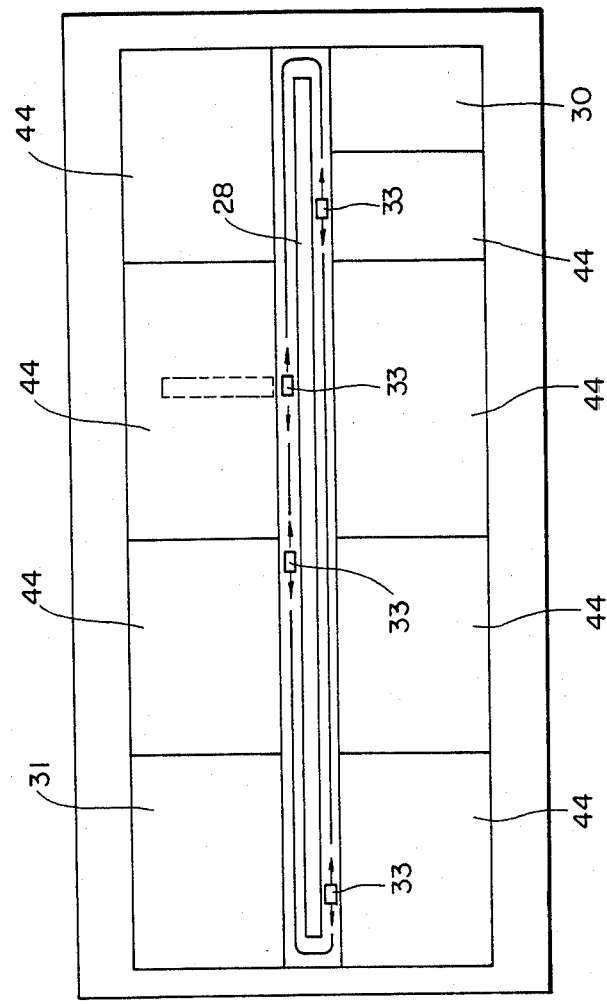
FIG. 9 is a plan view showing another embodiment of this invention.

This invention is not restricted to the foregoing embodiment. The number of treatment sections may well be still larger, and the number of treating devices in each treatment section may well be different from that in the embodiment. Although, in the embodiment, the conveyor device is adapted to move only within the building, it may well go directly into and out of an adjoining building in consideration of the couplings with other jobs. In the embodiment, the loading position and unloading position of each treating device are provided at an identical end, and the single transfer device is used in common. These loading and unloading positions, however, may well be separately arranged at the respective ends of the automated treatment device. The transfer device is provided with a mechanism for positioning the conveyor device and a mechanism for confirming the transfer of workpieces. It is also allowed that when positioned, the conveyor device and the treating device are docked so as to exchange information between both the devices under this state. The transfer device may well be a roller conveyor system, a pusher system or the like. The conveyor device may well be controlled by a wired system. The conveyor device may well be other then the type which runs on the floor. It is also allowed that, as shown in FIG. 9, the stocker 28 is arranged in the middle, around which the conveyor devices 33 are turned so as to carry workpieces to respective treatment sections 44. In addition, this invention is applicable to techniques other than the wafer processings.

As described above, according to the manufacturing system of this invention, the product management, the process management, the treatment conveyance management etc. are all executed by the automatic control employing the computer etc., so that the respective treatment sections are organically controlled to smooth the flow of workpieces and to efficiently perform treatments successively from a desired lot. Therefore, the reduction of the treatment cost can be achieved.

According to this invention, the job space and the preservation space are separated, and the former being a highly clean room can be made narrower than in the prior art. Therefore, the miniaturization of the air-conditioning and dust-removing equipment can be achieved, and the equipment cost can be lightened.

According to this invention, the operator does not enter the job space, and the processing conditions etc. of the respective treatment devices are properly controlled by the computer, so that very fine treatments can also be performed exactly and reliably and that the available percentage is enhanced.

According to this invention, the arrangement of the treating devices has the construction in which the job-shop-type and the flow-shop-type are coupled, so that the respective works can be caused to flow efficiently. In particular, according to this flow-shop-type, even a new series of products can be caused to flow as a line rationalized similarly to old products merely by adding data into the computer. Even in case of introducing new processes, they can be smoothly put into lines by handling them as groups of additional installations. Owing to the flow-shop-type, the necessary site can be narrowed.

What is claimed is:

1. A manufacturing system for providing a plurality of different treatments to semiconductor workpieces to manufacture semiconductor devices comprising:
   a conveyance path elongated along a predetermined path;
   a plurality of treatment sections, for subjecting the workpieces to respectively different treatments, said treatment sections being elongated relative to said conveyance path in a direction to intersect said conveyance path and arranged in side-by-side spaced relationship, each of said treatment sections having loading and unloading positions at a side facing said conveyance path; and
   conveyance means for moving the workpieces towards the loading positions and unloading positions of said respective treatment sections and along with conveyance path,
   the improvement wherein said plurality of treatment sections and said conveyance path are all located within a clean room area formed such that a first elongated portion of said clean room area is provided for said conveyance path and portions of said clean room area are provided for each of said treatment sections with the treatment section clean room portions being arranged in side-by-side spaced relationship along said first elongated portion and respectively joined to the first elongated portion of said clean room area; wherein said conveyance means includes a carrier capable of moving within the first elongated portion of said clean room area; and wherein said manufacturing system further comprises a preservation area located outside of said clean room area and adjacent to each of the treatment section clean room areas to permit access to each of said treatment sections from outside of said clean room area for repair and maintenance.

2. A manufacturing system according to claim 1, wherein said treatment sections intersect said conveyance path perpendicularly.

3. A manufacturing system according to claim 1, wherein said carrier comprises a truck having wheels and capable of moving on a floor of the first elongated portion.

4. A manufacturing system according to claim 1, wherein said elongated conveyance path has treatment sections arranged along both elongated sides thereof.

5. A manufacturing system according to claim 1, wherein said preservation area surrounds said clean room area.

6. A manufacturing system according to claim 4, wherein said preservation area surrounds said clean room area.

* * * * *